US011156692B2

(12) United States Patent
Golger

(10) Patent No.: US 11,156,692 B2
(45) Date of Patent: Oct. 26, 2021

(54) CALIBRATING DIFFERENTIAL MEASUREMENT CIRCUITRY

(71) Applicant: Teradyne, Inc., North Reading, MA (US)

(72) Inventor: Igor Golger, North Reading, MA (US)

(73) Assignee: TERADYNE, INC., North Reading, MA (US)

(*) Notice: Subject to any disclaimer, the term of this patent is extended or adjusted under 35 U.S.C. 154(b) by 42 days.

(21) Appl. No.: 16/794,865

(22) Filed: Feb. 19, 2020

(65) Prior Publication Data

US 2021/0255268 A1 Aug. 19, 2021

(51) Int. Cl.
*G01R 35/00* (2006.01)
*H03F 3/45* (2006.01)
(Continued)

(52) U.S. Cl.
CPC ....... *G01R 35/007* (2013.01); *G01R 31/2834* (2013.01); *H03F 3/45* (2013.01); *H03M 1/1023* (2013.01); *H03F 2203/45151* (2013.01)

(58) Field of Classification Search
CPC ............ G01R 31/2834; G01R 19/0092; G01R 1/203; G01R 33/0023; G01R 33/0035; G01R 33/0094; G01R 33/072; G01R 35/005; G01R 19/10; G01R 31/3193; G01R 19/16576; G01R 31/31924; H03F 3/45; H03F 2200/261; H03F 3/45475; H03F 2200/294; H03F 2203/45026; H03F 2203/45138; H03F 2203/45174;
(Continued)

(56) References Cited

U.S. PATENT DOCUMENTS 6,981,192 B2   12/2005   Panis
7,642,802 B2   1/2010    Adam et al.
(Continued)

FOREIGN PATENT DOCUMENTS

JP   06-069858 U   9/1994
JP   2000-304818 A  11/2000
JP   2017-120253 A   7/2017

OTHER PUBLICATIONS

Written Opinion Search Report for International Application No. PCT/US2021/014334, dated May 12, 2021, (3 pages).
(Continued)

*Primary Examiner* — Vinh P Nguyen
(74) *Attorney, Agent, or Firm* — Burns & Levinson LLP

(57) ABSTRACT

Example circuitry includes a first circuit to provide a low signal; a second circuit to provide a high signal, where the high signal has a greater voltage magnitude than the low signal; and a differential amplifier configured to receive the low signal from the first circuit and the high signal from the second circuit. The differential amplifier is for producing an output voltage that is based on the high signal and the low signal. The example circuitry includes a first measurement circuit to measure the output voltage; a second measurement circuit to measure the low signal at the first circuit; and processing logic to determine a differential measurement based on the output voltage measured by the first measurement circuit, the low signal measured by the second measurement circuit, and calibration values obtained for the circuitry.

21 Claims, 2 Drawing Sheets

(51) Int. Cl.
*G01R 31/28* (2006.01)
*H03M 1/10* (2006.01)

(58) Field of Classification Search
CPC ............. H03F 1/02; H03F 2200/129; H03F 2200/135; H03F 2200/156; H03F 2200/171; H03F 2200/264; H03F 2200/27; H03F 2200/321; H03F 2200/375; H03F 2203/45288; H03F 2203/45552; H03F 2203/45564; H03F 2203/45594; H03F 2203/45596; H03F 3/00; H03F 3/393; H03F 3/45071; H03F 2203/45476; H03F 2203/45508; H03F 2200/228; H03M 1/1023; G01M 11/02; G01M 7/025; G01D 18/00; G01D 18/001; G01D 18/008
See application file for complete search history.

(56) References Cited

U.S. PATENT DOCUMENTS

| | | | |
|---|---|---|---|
| 8,531,176 B2* | 9/2013 | Roach | G01R 13/32 |
| | | | 324/76.12 |
| 9,157,963 B2 | 10/2015 | Li | |
| 9,362,874 B2* | 6/2016 | Jasa | H03F 3/45475 |
| 9,379,676 B2 | 6/2016 | Johnson et al. | |
| 9,859,878 B2* | 1/2018 | Lyden | G01N 27/3273 |
| 10,326,429 B1 | 6/2019 | Lin | |
| 2005/0231189 A1 | 10/2005 | Leip | |
| 2006/0038578 A1 | 2/2006 | Hashimoto | |
| 2009/0058698 A1 | 3/2009 | Chen | |
| 2018/0316424 A1 | 11/2018 | Gohel et al. | |

OTHER PUBLICATIONS

International Search Report for International Application No. PCT/US2021/014334, dated May 12, 2021, (3 pages).

* cited by examiner

CALIBRATING DIFFERENTIAL MEASUREMENT CIRCUITRY

TECHNICAL FIELD

This specification relates generally to example processes for calibrating differential measurement circuitry.

BACKGROUND

An example differential measurement circuit generates an output voltage that is based on the difference between two input signals. An ideal differential measurement circuit changes its output only in response to changes in the difference between the two input signals. So, for example, if the two input signals increase or decrease in voltage by equal amounts, the output voltage of an ideal differential measurement will not change. However, if one of the input signals changes and the other does not, or the two input signals change differently, the output voltage of an ideal differential measurement circuit will change.

SUMMARY

Example circuitry includes a first circuit to provide a low signal; a second circuit to provide a high signal, where the high signal has a greater voltage magnitude than the low signal; and a differential amplifier configured to receive the low signal from the first circuit and the high signal from the second circuit. The differential amplifier is for producing an output voltage that is based on the high signal and the low signal. The example circuitry includes a first measurement circuit to measure the output voltage; a second measurement circuit to measure the low signal at the first circuit; and processing logic to determine a differential measurement based on the output voltage measured by the first measurement circuit, the low signal measured by the second measurement circuit, and calibration values obtained for the circuitry. The example circuitry may include one or more of the following features, either alone or in combination.

The processing logic may be configured to determine the differential measurement (hs−ls) as follows $$(hs - ls) = \frac{Vo}{GH} - ls(m) * \frac{GH + GL}{GH} - \frac{Ofs}{GH}$$

where Vo is the output voltage measured by the first measurement circuit, ls(m) is the low signal measured by the second measurement circuit, GH and GL are the calibration values, and Ofs is an offset value produced when the low signal and the high signal are at or near zero volts (0V).

The first measurement circuit may include a first analog-to-digital converter (ADC), the second measurement circuit may include a second ADC, and the second ADC may have a lower accuracy than a final measurement specification for the circuitry. The first measurement circuit may include a first ADC, the second measurement circuit may include a second ADC, and the first ADC may be more accurate than the second ADC.

In the preceding equation, GH may be a positive value and GL may be a negative value that is different from GH, where a difference between absolute values of GH and GL may be 10% or less. A difference between absolute values of GH and GL may be 5% or less. An absolute value of ls(m) may be 200 mV or less. GH may be a value that is determined by connecting the first circuit to electrical ground and by connecting the second circuit to a known voltage. GH+GL may be a value that may be determined by connecting the first circuit and the second circuit together and applying known voltage to the first circuit and the second circuit connected together. GH and GL may be determined separately from each other.

The differential amplifier may include resistors on a feedback path and a feedforward path. The output voltage may be based, at least in part, on values of the resistors. The processing logic may include one or more microprocessors. The processing logic may include programmable logic. The circuitry may be part of a ground re-referencing circuit.

Example automatic test equipment (ATE) includes a circuit board to connect to a device under test (DUT), where the DUT is connected to a first electrical reference on the circuit board; and test circuitry connected to a second electrical reference, where the second electrical reference is at a different voltage than the first electrical reference which causes a pair of signals output from the DUT to the test circuitry to change voltage values while maintaining a constant voltage difference. The test circuitry may include a first circuit to provide a low signal in the pair of signals; a second circuit to provide a high signal in the pair of signals, where the high signal has a greater voltage magnitude than the low signal; and a differential amplifier configured to receive the low signal from the first circuit and the high signal from the second circuit. The differential amplifier may be for producing an output voltage that is based on a difference between the high signal and the low signal. The test circuitry may also include a first measurement circuit to measure the output voltage; a second measurement circuit to measure the low signal at the first circuit; and processing logic to determine a differential measurement based on the output voltage measured by the first measurement circuit, the low signal measured by the second measurement circuit, and calibration values obtained for the test circuitry. The example ATE may include one or more of the following features, either alone or in combination.

The example ATE may include a test instrument for performing on or more tests on the DUT. The test circuitry may be part of the test instrument. The first electrical reference may be a first electrical ground for the DUT and the second electrical reference may be a second electrical ground for the test circuitry.

The processing logic may be configured to determine the differential measurement (hs−ls) as follows $$(hs - ls) = \frac{Vo}{GH} - ls(m) * \frac{GH + GL}{GH} - \frac{Ofs}{GH}$$

where Vo is the output voltage measured by the first measurement circuit, ls(m) is the low signal measured by the second measurement circuit, GH and GL are calibration values, and Ofs is an offset value produced when the low signal and the high signal are at or near zero volts (0V).

The first measurement circuit may include a first ADC, the second measurement circuit may include a second ADC, and the second ADC may have a lower accuracy than a final measurement specification for the test circuitry. The first measurement circuit may include a first ADC, the second measurement circuit may include a second ADC, and the first ADC may be more accurate than the second ADC.

In the preceding equation, GH may have a positive value and GL may have a negative value that is different from GH. A difference between absolute values of GH and GL may be 5% or less.

Any two or more of the features described in this specification, including in this summary section, can be combined to form implementations not specifically described herein.

The systems and techniques described herein, or portions thereof, can be implemented using or controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

An example differential measurement circuit generates an output voltage that is based on the difference between two input signals. For example, a differential gain is applied to the difference between the two input signals to generate the output voltage. Real-world differential measurement circuitry may be behave differently than the ideal differential measurement circuitry described previously. For example, real-world differential measurement circuitry may generate different output voltages even if the two input signals increase or decrease in voltage by equal amounts. This behavior may be due to errors introduced into the measurement process by a differential amplifier that is used to generate the output voltage. Accordingly, the circuitry and processes described herein are used to generate calibration values that may be used to correct, at least in part, for some or all of the errors introduced by the differential amplifier.

In this regard, the example circuitry described herein may include a differential measurement circuit for measuring a difference between two signals. The circuitry may be used in a test system to determine whether a device under test (DUT) passed or failed testing. In an implementation, the circuitry includes circuits to provide the two signals. In this case, the circuits to provide the two signals include a first circuit to provide a low signal (LS) and a second circuit to provide a high signal (HS). The high signal has a greater voltage magnitude than the low signal. A differential amplifier is configured to receive the low signal from the first circuit and the high signal from the second circuit, and to produce an output voltage that is based on the high signal and the low signal. In this example, the high signal amplification is different than the low signal amplification, which leads to errors in the output voltage as described previously.

A first measurement circuit is configured to measure the output voltage; and a second measurement circuit is configured to measure the low signal at the first circuit. Processing logic, such as a microprocessor or one or more other appropriate processing devices, is configured to determine a differential measurement based on the output voltage measured by the first measurement circuit, the low signal measured by the second measurement circuit, and calibration values obtained for the circuitry. The differential measurement may be based on, or may represent, a difference between the high signal and the low signal. The calibration values may be used to correct for errors introduced into the measurement process by the differential amplifier.

Figure 1:
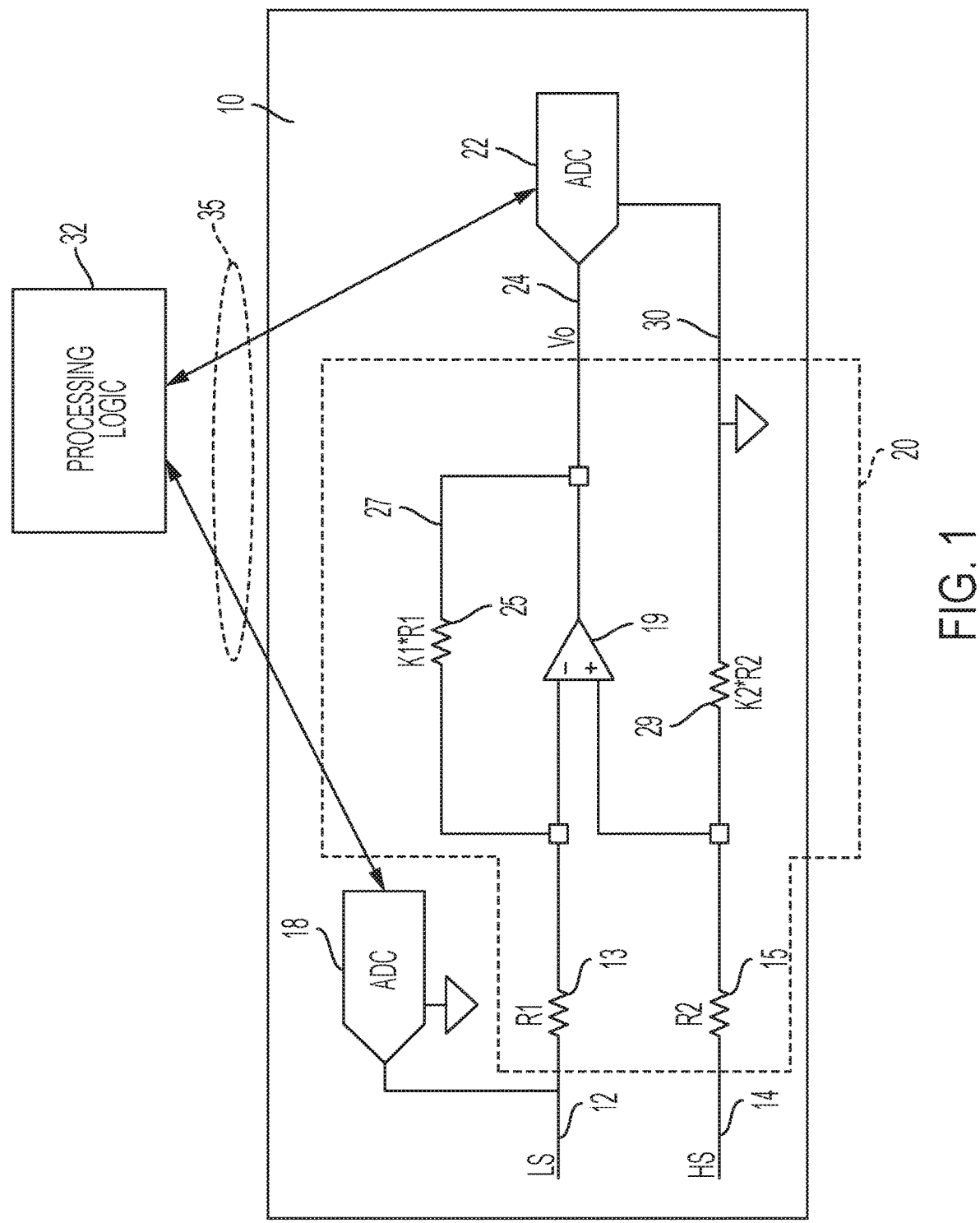
FIG. 1 is a circuit diagram showing example differential measurement circuitry.

Referring to FIG. 1, example differential measurement circuitry 10 includes example differential amplifier 20. The differential amplifier includes a first input circuit 12 in path with resistor 13 for providing a low signal (LS) and a second input circuit 14 in path with resistor 15 for providing a high signal (LS). In some implementations, the first input circuit and the second input circuit may be conductors only. In some implementations, the first input circuit and the second input circuit may contain passive electronic devices, active electronic devices, or a combination of passive electronic devices and active electronic devices. Resistor 13 has resistance R1 and resistor 15 has resistance R2. "High" and "low" do not require or imply any specific numerical values. In this example, the high signal has a greater voltage magnitude than the low signal. Analog-to-digital converter (ADC) 18 is connected to first input circuit 12 and is configured to measure LS on the first input circuit. An amplifier 19, such as an operational amplifier, is configured to receive HS and LS and to produce an output voltage (Vo) that is based on the difference between HS and LS. ADC 22 is connected along a circuit path 24 at the output of differential amplifier 20 and is configured to measure output voltage, Vo. In differential amplifier 20, a resistor 25 connects circuit path 24 to low-signal input circuit 12 along feedback path 27. A resistor 29 connects high-signal input circuit 14 to ADC 22 along feedforward path 30. The resistance of resistors 25 and 29 are expressed as products of K1*R1 and K2*R2, respectively, where K1 and K2 are constants that represent or effect the low side amplification and the high side amplification, respectively, of differential amplifier 20. Processing logic 32, which may be implemented using any appropriate circuitry or processing devices such as those described herein, corrects errors in output voltage, Vo, using calibration values. For example processing logic may use the calibration values to determine the differential voltage (hs−ls) in accordance with equation (1) below. Arrows 35 represent, conceptually, transmission of values measured by ADCs 18 and 22.

In this regard, errors in differential amplifier 20 may be introduced into the output voltage if K1≠K2. Although K1 and K2 may differ in absolute value, in some implementations K1 and K2 are close in absolute value. For example, K1 and K2 may be within 10% of each other, within 5% of each other, within 3% of each other, or within 1% of each other. The circuitry and processes described herein may be used to determine a differential measurement, namely (hs−ls), in which the errors introduced into the measurement process by the differential amplifier have been reduced, minimized, or eliminated. In other words, (hs−ls) may be the difference between the high signal (HS) and the low signal (LS) with any errors introduced by the differential amplifier or other circuitry of FIG. 1 reduced, minimized, or eliminated. In an example, this differential voltage (hs−ls) is expressed as follows:

$$(hs-ls) = \frac{Vo}{GH} - ls(m) * \frac{GH+GL}{GH} - \frac{Ofs}{GH}$$

where Vo is the output voltage measured by ADC 22, ls(m) is the low signal (LS) measured by ADC 18, GH and GL are the amplifier's gain values, and Ofs is an offset value produced when the low signal and the high signal are set at or near zero volts (0V).

In equation (1), the differential voltage (hs−ls) is expressed in terms of two measurements, the output voltage Vo measured by ADC 22 and ls(m) measured by ADC 18. ls(m) is a separate term in equation (1) that is multiplied by a small number, $$\frac{GH+GL}{GH}.$$

In this regard, since K1 is close in absolute value to K2 in this example, GL is almost equal to −GH causing the value of $$\frac{GH+GL}{GH}$$

to be relatively small. So adding GL and GH produces a value that is close to zero. In some examples, the absolute values of GL and GH may be within 10% of each other, within 5% of each other, within 3% of each other, or within 1% of each other. Because the contribution of the $$\frac{GH+GL}{GH}$$

error will be relatively small, ADC 18 need not have high accuracy. That is, even if ADC 18 has low accuracy—for example, ADC 18 is 10% inaccurate, 20% inaccurate, 30% inaccurate, and so forth—the error term of equation (1) that includes ls(m) will be small and, therefore, will have little effect on the value of (hs−ls).

In some implementations, ADC 18 may have a lower accuracy than a final measurement specification for circuitry 10. In an example, ADC 22 may be more accurate than ADC 18. Consequently, ADC 18 may be less expensive than ADC 22. In some implementations, the absolute value of ls(m)—the value measured by ADC 18—is relatively low. For example, ls(m) may be 500 mV (millivolts) or less, 400 mV or less, 300 mV or less, 200 mV or less, or 100 mV or less. In some implementations, the low voltage LS is 50% of the high voltage HS; the low voltage LS is 40% of the high voltage HS; the low voltage LS is 30% of the high voltage HS; the low voltage LS is 20% of the high voltage HS; or the low voltage LS is 10% of the high voltage HS.

In some implementations, the calibration values are the gains or "gain factors" GH and GL. In some implementations, the calibration values are based on those gains. The calibration values may be applied according to equation (1) in order to calibrate-out errors introduced by the differential amplifier. For example, the processing logic may use the calibration factors to determine the differential voltage (hs−ls) using measurements by ADCs 18 and 22 for ls(m) and Vo and equation (1) above. The following operations may be performed to obtain gains GH and GL of equation (1).

In a first example process to obtain GH, connect first input circuit 12 to electrical ground in order to provide a ground signal at LS; connect second input circuit 14 to a known voltage level in order to provide a known voltage signal at HS; and measure Vo using ADC 22. Vo here is referred to as Vo(hs) because it is based on a value of the high signal only. The output voltage Vo(hs) is equal to HS*GH, where GH is a gain from second input circuit 14 to ADC 22. GH can be determined by Vo(hs)/HS, since the voltage signal HS is known and the output voltage Vo(hs) is known.

In the first example process to obtain GL, connect second input circuit 14 to electrical ground in order to provide a ground signal at HS; connect first input circuit 12 to a known voltage level in order to provide a known voltage signal at LS; and measure Vo using ADC 22. Vo here is referred to as Vo(ls) because it is based on a value of the low signal only. The output voltage Vo(ls) is equal to LS*GL, where GL is a gain from first input circuit 12 to path 24. GL can be determined by Vo(ls)/LS since the output voltage Vo(ls) is known and voltage signal LS is known and can be measured by ADC 18. In this example, LS will be a negative value.

Alternatively, the following operations may be performed in a second example process to obtain gain values for GH and GH+GL. Knowing GH and GH+GL, the value for GL can be determined by subtracting GH from GH+GL. These operations may be used, for example, when it is difficult to connect to first input circuit 12 to produce a known voltage at LS or that connection cannot be made.

In the second example process to obtain GH, connect first input circuit 12 to electrical ground in order to provide a ground signal at LS; and connect second input circuit 14 to a known voltage level. Accordingly, the output voltage Vo(hs) is equal to HS*GH, where GH is a gain from second input circuit 14 to ADC 22. GH can be determined since the voltage signal at HS is known and the output voltage Vo(hs) is known. That is, GH can be determined by Vo(hs)/HS, since the voltage signal at HS is known and the output voltage Vo(hs) is known The second example process obtains a singular value for GH+GL. That is, a single value for GH+GL is obtained; GL is not obtained separately. To obtain GH+GL, connect first input circuit 12 and second circuit input 14 together—for example, electrically short-circuit HS to LS. The resulting shorted pair is connected to a known voltage level, V(hl), which may be measured by ADC 18. In this example, the output voltage Vo is a function of V(hl) and is expressed as Vo(hl). Vo(hl) is determined as follows: Vo(hl)=V(hl)*GHL, where GHL is the gain from the electrically short-circuited HS-LS connection to ADC 22. GHL can be determined since the V(hl) is known and the output voltage Vo(hl) is known. That is GHL is defined as Vo(hl)/V(hl).

Due to linearity, the contribution of electrically short-circuited HS and LS can be presented as a superposition of HS and LS with their respective gains, as follows:

$$V(hl)*GHL = V(hl)*GH + V(hl)*GL \qquad (2)$$

To obtain GL, divide both sides of equation (2) by V(hl), which yields the following:

$$GHL = GH + GL$$

$$GL = GHL - GH$$

The output voltage Vo may be expressed as follows:

$$Vo = hs^* GH + ls(m)^* GL \quad (3)$$
$$= hs^* GH + ls(m)(GHL - GH)$$
$$= hs^* GH - ls(m)^* GH + ls^* GHL$$
$$= (hs - ls)GH + ls(m)(GHL)$$

Solving equation (3) for (HS-LS) yields:

$$(hs - ls) = \frac{Vo - ls(m)*GHL}{GH} \quad (4)$$
$$= \frac{Vo}{GH} - ls(m) * \frac{GHL}{GH}$$
$$= \frac{Vo}{GH} - ls(m) * \left(\frac{GL}{GH} + 1\right)$$

Equation (4) is the same as the following term of equation (1).

$$\frac{Vo}{GH} - ls(m) * \frac{GH + GL}{GH} \quad (5)$$

Note that equation (5) assumes a zero offset voltage value. A non-zero offset voltage (Ofs) value is taken into account and calibrated in equation (1) and can be added to equation (5) by setting HS and LS to zero and measuring the output voltage.

An example differential measurement circuit of the type described herein may be used in a ground re-referencing circuit. A ground re-referencing circuit may be included in test circuitry that is part of automatic test equipment (ATE). In example ATE, a circuit board, such as a device interface board (DIB), connects to a DUT. The DUT is connected to a first electrical reference—for example, a first electrical ground ("ground")—on the DIB. Test circuitry, which may be included in a test instrument, is connected to a second electrical reference—for example, a second electrical ground ("ground"). The second ground is at a different voltage than the first ground, which causes a pair of signals output from the DUT to the test circuitry to change voltage values, even when the pair of signals maintain a constant voltage difference. For example, the first and second electrical grounds may have voltage differences on the order of millivolts. In an example, the first and second electrical grounds may have a 200 mV difference.

Figure 2:
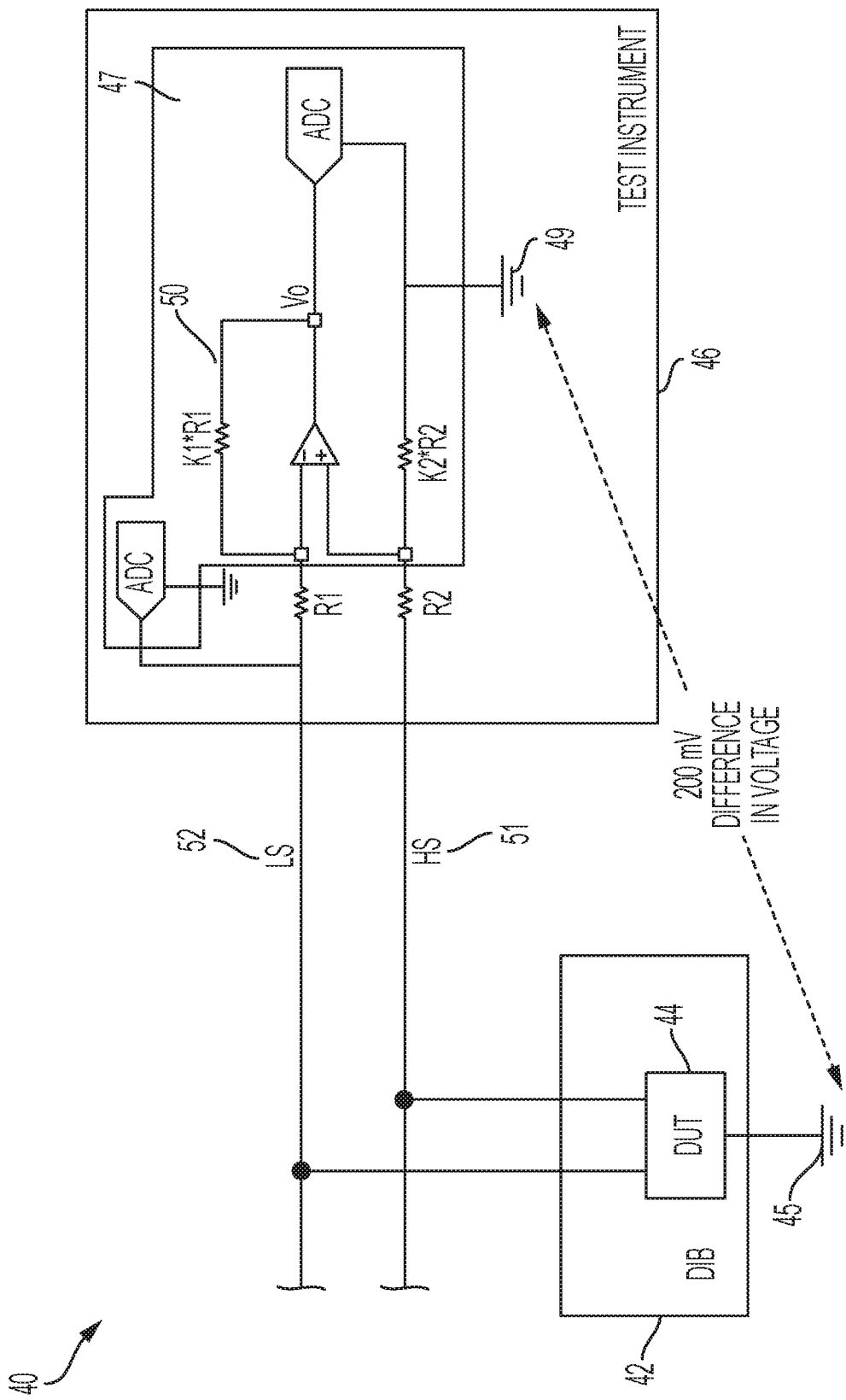
FIG. 2 is a block diagram showing components of example automatic test equipment that include differential measurement circuitry.

In FIG. 2, example ATE 40 includes a DIB 42 holding a DUT 44 connected to first ground 45. Example ATE 40 also includes a test instrument 46 containing test circuitry 47, such as pin electronics (PE) or a parametric measurement unit (PMU) connected to a second ground 49, which is at a different voltage value than first ground 45. Test circuitry 47 includes differential measurement circuitry, which may be of the type shown in FIG. 1. The differential measurement circuitry includes a differential amplifier 50 of the type described herein. High signal HS 51 and low signal 52 are sent from DUT 44 to test circuitry 47. These signals may be responsive to test signals output by test circuitry 47 or they may be independent of test signals output by test circuitry 47. Differential amplifier 50 compares high signal HS 51 and low signal 52 to produce an output voltage that may indicate whether DUT 44 passed or failed a test, or that may be used in further processing to determine whether DUT 44 passed or failed a test.

The difference in voltage levels between first ground 45 and second ground 49 introduces errors of the type described herein. For example, differential amplifier 50 may generate different output voltages (Vo) in cases where the high signal HS 51 and low 52 sent from DUT 44 increase or decrease in voltage by equal amounts. This may occur, for example, due to voltages that result from current loops produced by the different voltages levels for grounds 45 and 49. The processes described herein may be used to determine calibration values to correct these errors, to store those calibration values in computer memory, and to use those calibration values during circuit operation to produce corrected output voltages.

Testing performed using the example systems described herein may be implemented using hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The processes described herein may be performed by systems or any other appropriate computing device. The processes can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may include a direct physical connection or an indirect connection that includes intervening components but that nevertheless allows electrical signals to flow between connected components. Any "connection" involving electrical circuitry mentioned herein through which electrical signals flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. Circuitry comprising:
    a first circuit to provide a low signal;
    a second circuit to provide a high signal, the high signal having a greater voltage magnitude than the low signal;
    a differential amplifier configured to receive the low signal from the first circuit and the high signal from the second circuit, the differential amplifier for producing an output voltage that is based on the high signal and the low signal;
    a first measurement circuit to measure the output voltage;
    a second measurement circuit to measure the low signal at the first circuit; and
    processing logic to determine a differential measurement based on the output voltage measured by the first measurement circuit, the low signal measured by the second measurement circuit, and calibration values obtained for the circuitry.

2. The circuitry of claim 1, wherein the processing logic is configured to determine the differential measurement (hs−ls) as follows $$(hs - ls) = \frac{Vo}{GH} - ls(m) * \frac{GH + GL}{GH} - \frac{Ofs}{GH}$$

where Vo is the output voltage measured by the first measurement circuit, ls(m) is the low signal measured by the second measurement circuit, GH and GL are the calibration values, and Ofs is an offset value produced when the low signal and the high signal are at or near zero volts (0V).

3. The circuitry of claim 2, wherein GH is a positive value and GL is a negative value that is different from GH, where a difference between absolute values of GH and GL is 10% or less.

4. The circuitry of claim 2, wherein GH is a positive value and GL is a negative value that is different from GH, where a difference between absolute values of GH and GL is 5% or less.

5. The circuitry of claim 2, wherein an absolute value of ls(m) is 200 mV or less.

6. The circuitry of claim 2, wherein GH is a value that is determined by connecting the first circuit to electrical ground and by connecting the second circuit to a known voltage.

7. The circuitry of claim 2, wherein GH+GL is a value that is determined by connecting the first circuit and the second circuit together and applying known voltage to the first circuit and the second circuit connected together.

8. The circuitry of claim 2, wherein GH and GL are determined separately from each other.

9. The circuitry of claim 1, wherein the first measurement circuit comprises a first analog-to-digital converter (ADC), the second measurement circuit comprises a second ADC, and the second ADC has a lower accuracy than a final measurement specification for the circuitry.

10. The circuitry of claim 1, wherein the first measurement circuit comprises a first analog-to-digital converter (ADC), the second measurement circuit comprises a second ADC, and the first ADC is more accurate than the second ADC.

11. The circuitry of claim 1, wherein the differential amplifier includes resistors on a feedback path and a feedforward path, the output voltage being based, at least in part, on values of the resistors.

12. The circuitry of claim 1, wherein the processing logic comprises one or more microprocessors.

13. The circuitry of claim 1, wherein the processing logic comprises programmable logic.

14. The circuitry of claim 1, wherein the circuitry is part of a ground re-referencing circuit.

15. Automatic test equipment (ATE) comprising:
    a circuit board to connect to a device under test (DUT), the DUT being connected to a first electrical reference on the circuit board; and
    test circuitry connected to a second electrical reference, the second electrical reference being at a different voltage than the first electrical reference which causes a pair of signals output from the DUT to the test circuitry to change voltage values while maintaining a constant voltage difference;
    wherein the test circuitry comprises:
        a first circuit to provide a low signal in the pair of signals;
        a second circuit to provide a high signal in the pair of signals, the high signal having a greater voltage magnitude than the low signal;
        a differential amplifier configured to receive the low signal from the first circuit and the high signal from the second circuit, the differential amplifier for producing an output voltage that is based on a difference between the high signal and the low signal;
        a first measurement circuit to measure the output voltage;
        a second measurement circuit to measure the low signal at the first circuit; and
        processing logic to determine a differential measurement based on the output voltage measured by the first measurement circuit, the low signal measured by the second measurement circuit, and calibration values obtained for the test circuitry.

16. The ATE of claim 15, further comprising a test instrument for performing one or more tests on the DUT, the test circuitry being part of the test instrument.

17. The ATE of claim 16, wherein the first electrical reference is a first electrical ground for the DUT and the second electrical reference is a second electrical ground for the test circuitry.

18. The ATE of claim 15, wherein the processing logic is configured to determine the differential measurement (hs−ls) as follows $$(hs - ls) = \frac{Vo}{GH} - ls(m) * \frac{GH + GL}{GH} - \frac{Ofs}{GH}$$

where Vo is the output voltage measured by the first measurement circuit, ls(m) is the low signal measured by the second measurement circuit, GH and GL are calibration values, and Ofs is an offset value produced when the low signal and the high signal are at or near zero volts (0V).

19. The ATE of claim 18, wherein the first measurement circuit comprises a first analog-to-digital converter (ADC), the second measurement circuit comprises a second ADC, and the second ADC has a lower accuracy than a final measurement specification for the test circuitry.

20. The ATE of claim 18, wherein the first measurement circuit comprises a first analog-to-digital converter (ADC), the second measurement circuit comprises a second ADC, and the first ADC is more accurate than the second ADC.

21. The ATE of claim 18, wherein GH is a positive value and GL is a negative value that is different from GH, where a difference between absolute values of GH and GL is 5% or less.

* * * * *